United States Patent [19]

Garrity et al.

[11] Patent Number: 5,550,503
[45] Date of Patent: Aug. 27, 1996

[54] CIRCUITS AND METHOD FOR REDUCING VOLTAGE ERROR WHEN CHARGING AND DISCHARGING A CAPACITOR THROUGH A TRANSMISSION GATE

[75] Inventors: Doug Garrity, Gilbert; David Anderson, Scottsdale; Howard Anderson, Tempe; Brad Gunter, Phoenix; Danny Bersch, Gilbert, all of Ariz.

[73] Assignee: Motorola, Inc., Schaumburg, Ill.

[21] Appl. No.: 430,999

[22] Filed: Apr. 28, 1995

[51] Int. Cl.⁶ ............................................ H03K 17/687
[52] U.S. Cl. ........................ 327/437; 327/259; 327/287; 327/382
[58] Field of Search ........................ 327/262, 274, 327/280, 378, 379, 382, 427, 437, 239, 259, 287, 288; 377/79, 104, 105

[56] References Cited

U.S. PATENT DOCUMENTS

| | | | |
|---|---|---|---|
| 4,508,983 | 4/1985 | Allgood et al. | 327/382 |
| 4,511,814 | 4/1985 | Matsuo et al. | 327/437 |
| 4,599,522 | 7/1986 | Matsuo et al. | 327/382 |
| 4,628,250 | 12/1986 | Lee | 327/437 |
| 4,929,854 | 5/1990 | Iino et al. | 327/239 |
| 4,982,116 | 1/1991 | Lee | 327/259 |
| 5,111,072 | 5/1992 | Seidel | 327/382 |
| 5,306,962 | 4/1994 | Lamb | 327/259 |
| 5,341,031 | 8/1994 | Kinoshita et al. | 327/259 |
| 5,392,205 | 2/1995 | Zavaleta | 363/59 |
| 5,440,250 | 8/1995 | Albert | 327/239 |
| 5,453,707 | 9/1995 | Hiratsuka et al. | 327/259 |

FOREIGN PATENT DOCUMENTS 60-154713  8/1985  Japan.

Primary Examiner—Timothy P. Callahan
Assistant Examiner—My-Trang Nu Ton
Attorney, Agent, or Firm—Gary W. Hoshizaki

[57] ABSTRACT

A circuit and method for reducing voltage error when charging and discharging a storage capacitor (44) through a transmission gate (43). The storage capacitor (44) stores or holds a voltage coupled through the transmission gate (43) when the transmission gate (43) is disabled. The circuit comprises a clock generation circuit (47) providing complementary clock signals for enabling and disabling the transmission gate (43) and a charge negating transmission gate (46). The clock generation circuit (47) provides the complementary clock signals simultaneously to the transmission gates (43, 46). Alternate paths for dissipating channel charge of the transistors which comprise the transmission gate (43) are not formed by providing the complementary clock signals simultaneously. The channel charge is then canceled by the charge negating transmission gate (46) reducing voltage error on the storage capacitor (44).

16 Claims, 5 Drawing Sheets

5,550,503

CIRCUITS AND METHOD FOR REDUCING VOLTAGE ERROR WHEN CHARGING AND DISCHARGING A CAPACITOR THROUGH A TRANSMISSION GATE

BACKGROUND OF THE INVENTION

This invention relates, in general, to switched capacitor circuits, and more particularly, to reducing voltage error when charging and discharging a capacitor through a transmission gate.

In an integrated circuit, switches for coupling one element to another are formed from transistors. One type of switch formed from transistors is known as a transmission gate. A transmission gate formed in a Complementary Metal Oxide Semiconductor (CMOS) wafer process flow is well known and comprises a n and p-channel enhancement MOSFET (Metal Oxide Semiconductor Field Effect Transistors).

A transmission gate made from both n and p-channel enhancement MOSFETs is capable of coupling a voltage approaching either power supply voltage of a circuit to a storage element. A transmission gate is enabled and disabled by a control signal and a complementary control signal. An enabled transmission gate has a finite resistance that corresponds to transistor size (W/L ratio). For example, increasing transistor size (W/L ratio) of a transmission gate reduces resistance. A disabled transmission gate has an extremely high impedance and approximates an open circuit.

A switched capacitor network typically comprises transmission gates, capacitors, and active circuits such as amplifiers. Transmission gates are used to couple one element to another. In particular, a transmission gate is effective in coupling a voltage to a capacitor for storing charge. The capacitor is charged and discharged through the transmission gate. Ideally, a voltage applied to a transmission gate is transferred and stored on a capacitor. In practice, the voltage on the capacitor is not identical to the applied voltage. It is well known that the time period for charging and discharging the capacitor, the resistance of the transmission gate, and charge coupling due to parasitic capacitance of the transmission gate, affect the resultant voltage on the capacitor.

It would be of great benefit if a circuit and method for reducing voltage error when charging and discharging a capacitor through a transmission gate could be provided for enhancing switched capacitor network performance.

DETAILED DESCRIPTION OF THE DRAWINGS

A transmission gate is a non-ideal switch for charging and discharging a storage capacitor. In general, a transmission gate comprises a n-channel enhancement Metal Oxide Semiconductor Field Effect Transistor (MOSFET) and a p-channel enhancement MOSFET coupled in parallel. Complementary control signals are required for enabling and disabling the transmission gate. A MOSFET is enabled by a gate voltage applied from the gate to source of the device. The gate voltage induces a conductive channel along a surface of a semiconductor material coupling the drain to the source of the device. The conductive channels of the complementary MOSFETs which form a transmission gate have a finite resistance that impacts the speed in which a transmission gate charges or discharges a storage capacitor. In other words, the resistance of the transmission gate and the storage capacitor form a RC (Resistor/Capacitor) time constant that determines how quickly and accurately the storage capacitor is charged and discharged within a given time period. In general, the accuracy in which a transmission gate couples a voltage to a storage capacitor is critical to the performance of a switched capacitor network.

Figure 1:
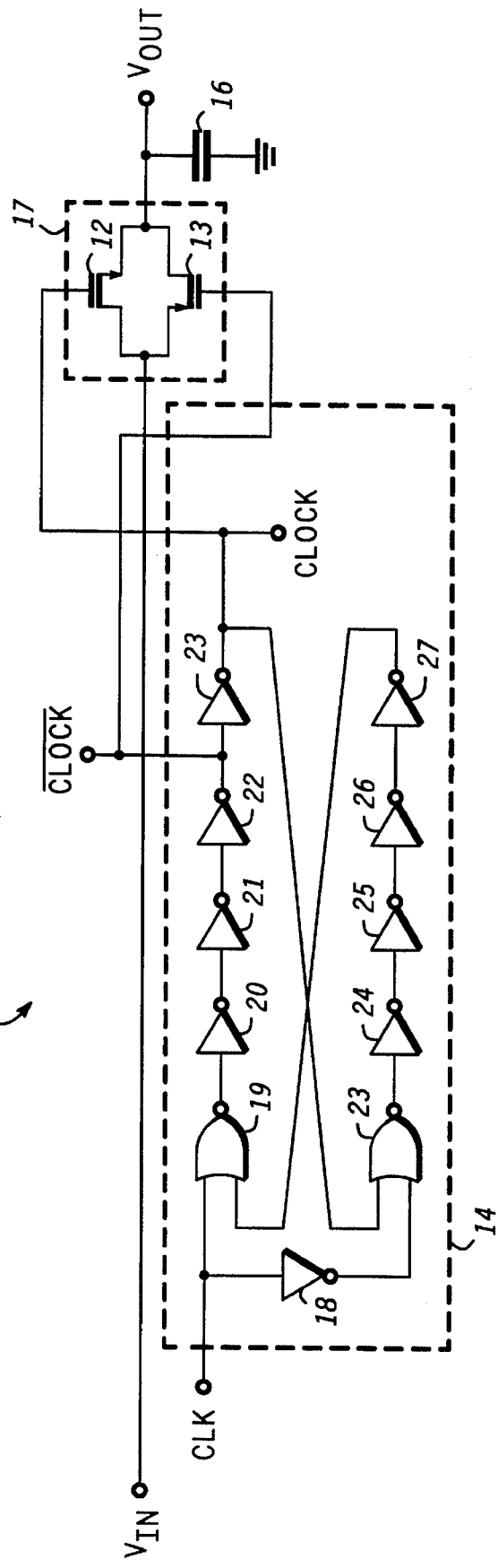
FIG. 1 is a schematic diagram of a transmission gate coupled to a capacitor and a clock circuit for enabling and disabling the transmission gate.

FIG. 1 is a schematic diagram of a simple switched capacitor network 11 comprising a transmission gate 17, a storage capacitor 16, and a clock circuit 14. Switched capacitor network 11 illustrates basic principles commonly employed for charging and discharging a storage capacitor.

Transmission gate 17 couples a voltage applied to an input $V_{IN}$ to an output $V_{OUT}$. A storage capacitor 16 stores or holds a voltage at output $V_{OUT}$ when transmission gate 17 is disabled. Transmission gate 17 comprises a n-channel enhancement MOSFET 12 and a p-channel enhancement MOSFET 13 coupled in parallel. The p and n-channel enhancement MOSFETs (12 and 13) are sized having an on-resistance that meets the accuracy requirements of switched capacitor network 11 for charging and discharging storage capacitor 16 within a clock period of clock circuit 14.

Clock circuit 14 provides control signals for enabling and disabling transmission gate 17. In general, most switched capacitor networks are switched or clocked at regular intervals. A transmission gate is designed having a resistance that is capable of charging and discharging a storage capacitor to the level of accuracy required within a time period of a clock signal. Clock circuit 14 typifies a circuit commonly used to generate complementary control signals for a switched capacitor network. Clock circuit 14 has a CLK input, a CLOCK output, and a CLOCKBAR output.

Clock circuit 14 comprises NOR gates 19 and 23, and inverters 18, 20–23, and 24–27. NOR gate 19 has a first input coupled to the CLK input, a second input, and an output. Inverter 20 has an input coupled to the output of NOR gate 19 and an output. Inverter 21 has an input coupled to the output of inverter 20 and an output. Inverter 22 has an input coupled to the output of inverter 21 and an output coupled to the CLOCKBAR output. Inverter 23 has an input coupled to the output of inverter 22 and an output coupled to the CLOCK output. The CLOCK output couples to a gate of n-channel enhancement MOSFET 12 of transmission gate 17. The CLOCKBAR output couples to a gate of p-channel enhancement MOSFET 13. Inverter 18 inverts a CLOCK signal applied to the CLOCK input. Inverter 18 has an input coupled to the CLOCK input and an output. NOR gate 23 has a first input coupled to the output of inverter 18, a second input coupled to the output of inverter 23, and an output. Inverter 24 has an input coupled to the output of NOR gate 23 and an output. Inverter 25 has an input coupled to the output of inverter 24 and an output. Inverter 26 has an input coupled to the output of inverter 25 and an output. Inverter 27 has an input coupled to the output of inverter 26 and an output coupled to the second input of NOR gate 19.

Clock circuit 14 receives a signal and provides a clock signal and its complement at the CLOCK and CLOCKBAR output. A clock signal provided at the CLOCK output is delayed by inverter 23 from a CLOCKBAR signal provided at the CLOCKBAR output. Clock circuit 14 is well known by one skilled in the art and is designed to provide fast output transitions at the CLOCK and CLOCKBAR outputs.

Figure 2:
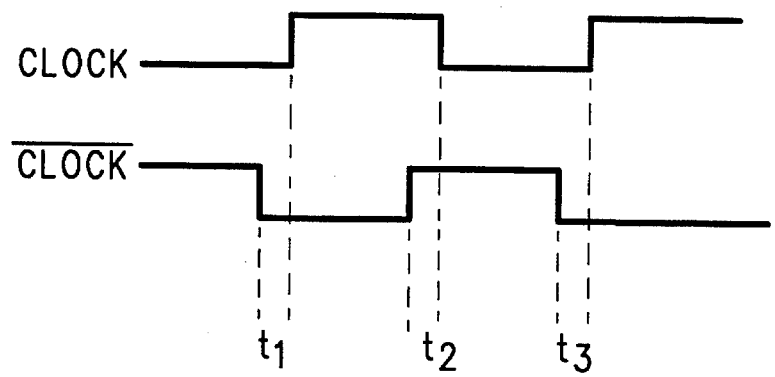
FIG. 2 is a timing diagram illustrating complementary clock signals of the clock circuit of FIG. 1.

FIG. 2 is a timing diagram illustrating the CLOCK and CLOCKBAR outputs of clock circuit 14 of FIG. 1. In general, clock circuits do not provide complementary signals simultaneously. The CLOCK output is delayed from the CLOCKBAR output by a time indicated by periods $t_1$, $t_2$, and $t_3$. The delay between the CLOCK and CLOCKBAR outputs is approximately the delay of inverter 23.

Figure 3:
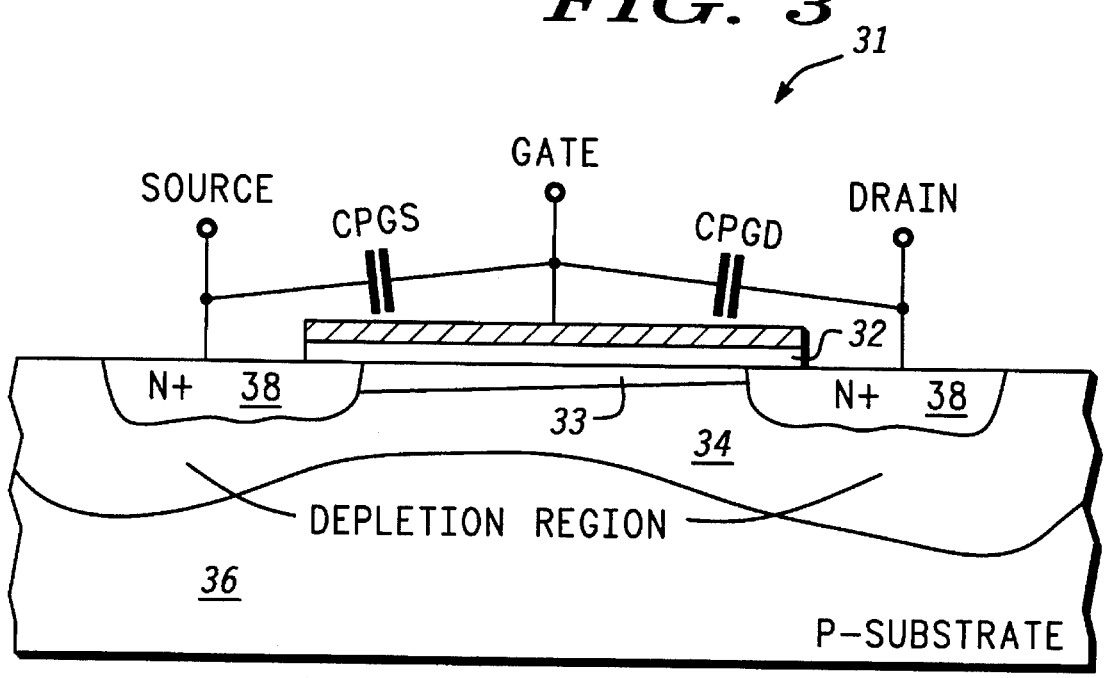
FIG. 3 is a cross-sectional view of a n-channel enhancement MOSFET transistor illustrating parasitic capacitance from gate to source and from gate to drain.

FIG. 3 is a cross-sectional view of a n-channel enhancement MOSFET 31 illustrating a channel 33 and parasitic capacitances CPGS and CPGD that produce a voltage error when used in a transmission gate for coupling a voltage to a storage capacitor. N-channel enhancement MOSFET 31 includes a gate, a drain, and a source. A p-channel enhancement MOSFET is formed similar to n-channel enhancement MOSFET 31 but of opposite type materials.

N-channel enhancement MOSFET 31 is formed in a p-substrate 36. P-substrate 36 is typically coupled to the negative most voltage. N+ implant 38 form a drain and a source in p-substrate 36. An oxide layer 32 isolates a gate of MOSFET 31 from the surface of p-substrate 36. A positive voltage applied across the gate to source forms a n-type channel under oxide layer 32. The n-type channel couples the drain to source thereby forming a low resistance path for conducting. A depletion region 34 is formed between p-substrate 36 and N+ implant 38 and n-type channel 33 due to the reverse voltage bias therebetween.

The parasitic capacitance from gate to drain (CPGD) and from the gate to source (CPGS) of a MOSFET is inherent in the transistor structure. One source of the capacitance is the overlap of gate oxide 32 over either the drain or source N+ implant 38. The parasitic capacitance couples a gate of a MOSFET to a storage capacitor when the MOSFET is used in a transmission gate. The parasitic capacitance (either CPGD or CPGS) injects charge or pulls charge from a storage capacitor when a voltage transition is applied to the gate of the device. The charge coupled through the parasitic capacitance of the transistors which form a transmission gate is a source of voltage error on a storage capacitor.

Another source of voltage error from the transmission gate is the channel charge from each MOSFET. The charge which forms a channel enters from the drain and source when the transmission gate is enabled. Similarly, the channel charge exits from the drain or source of a MOSFET when the transmission gate is disabled. The channel charge of a MOSFET injected to or pulled from a storage capacitor is a source of voltage error to a storage capacitor.

Figure 4:
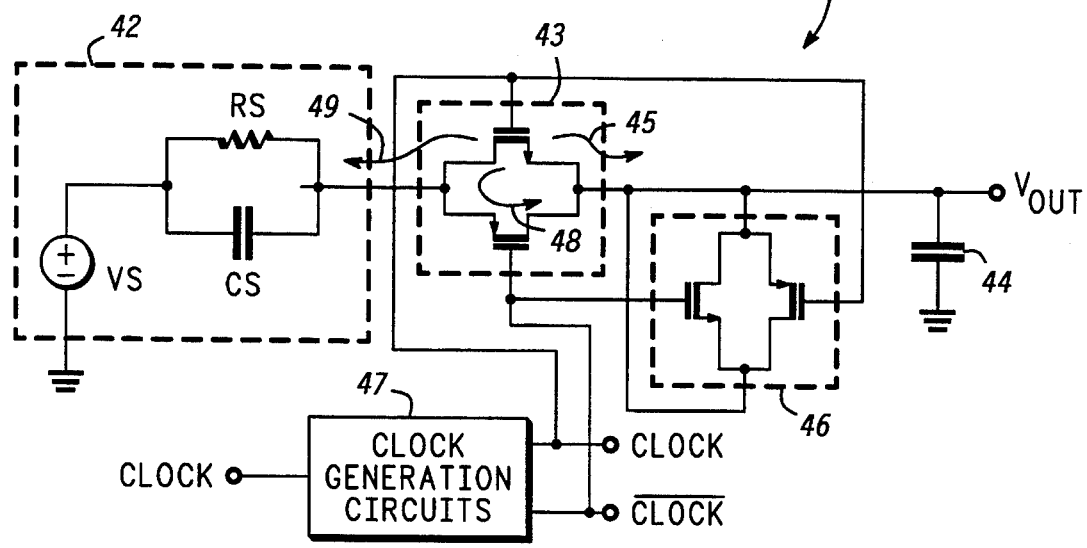
FIG. 4 is a schematic diagram of a voltage source coupled to a transmission gate and clock generation circuit for enabling and disabling the transmission gate in accordance with the present invention, a dummy transmission gate is used to cancel out parasitic charge coupling effects.

FIG. 4 is a schematic diagram of a switched capacitor network 41. Switched capacitor network 41 comprises a voltage source 42, a transmission gate 43, a transmission gate 46, a clock generation circuit 47, and a storage capacitor 44. Voltage source 42 provides a voltage to transmission gate 43 which is coupled to an output $V_{OUT}$. Storage capacitor 44 holds a voltage at output $V_{OUT}$ when transmission gate 43 is disabled.

Transmission gates 43 and 46 each comprise a p-channel and n-channel enhancement MOSFET. Transmission gate 46 is added to switched capacitor network 41 to negate charge injection to or from storage capacitor 44 from transmission gate 43 during a clock transition. The principal behind transmission gate 46 is to provide an equivalent device that undergoes an opposite transition such that any charge injected to storage capacitor 44 is also injected out of storage capacitor 44 or vice versa. The channel charge is also compensated for by turning on transmission gate 46 (to form a channel in each transistor) when transmission gate 43 is turned off whereby transmission gate 46 receives the channel charge of transmission gate 43 and transmission gate 43 does not inject the channel charge into storage capacitor 44. In the preferred embodiment, transmission gate 46 has transistors having geometries one half the size of the transistors of transmission gate 43. The reduced size of transmission gate 46 cancels charge injected or pulled by transmission gate 43 by providing an equivalent but opposite charge by tying both the input and output of transmission gate 46 to $V_{OUT}$.

Utilizing a charge negating transmission gate such as transmission gate 46 with a standard clock circuit as shown in FIG. 1 provides a significant improvement in the voltage error found on a storage capacitor. Still, the results are insufficient for many applications. Smaller storage capacitors operating at higher speeds in switched capacitor networks require further improvement in reducing voltage error due to charge coupling through a transmission gate.

A careful analysis of switched capacitor network 41 illustrates that transmission gate 46 is not operated identically (and oppositely) to transmission gate 43 and that the source impedance of voltage source 42 also affects voltage error on storage capacitor 44. Transmission gate 43 is coupled between the voltage source and the output $V_{OUT}$. Transmission gate 46 is coupled only to $V_{OUT}$. A combination of delay between the CLOCK and CLOCKBAR and a high source impedance induces a voltage error on storage capacitor 44.

Voltage source 42 has a source impedance having a resistance RS and a capacitance CS. Operational amplifiers are commonly used as a voltage source in a switched capacitor circuit. An operational amplifier made from MOSFET transistor has a high output resistance and capacitance, for example, RS=1 megaohm and CS=1 picofarad is common for CMOS (Complementary Metal Oxide Semiconductors) operational amplifiers. A high source impedance from voltage source 42 impedes the flow of channel charge from the transistors of transmission gate 43 when it is disabled. If the flow of channel charge is impeded it will take a path of least resistance to leave the channel which could add or subtract to the charge on storage capacitor 44.

Ideally for canceling charge, half the channel charge of the n-channel enhancement MOSFET of transmission gate 43 dissipates through voltage source 42 and half to $V_{OUT}$.

Enabling the n-channel enhancement MOSFET of transmission gate 46 (which is half the size of the n-channel enhancement MOSFET of transmission gate 43) utilizes the channel charge to form its own channel. Thus, the voltage of storage capacitor 44 is unaffected by disabling transmission gate 43.

Delay between the CLOCK and CLOCKBAR signals of a clock circuit generally used in a switched capacitor network creates a situation where the p-channel enhancement MOSFET of transmission gate 43 is enabled for a short period of time when the n-channel enhancement MOSFET of transmission gate 43 is disabled. In practice, the delay between the complementary clock signals and a high source impedance produce an error voltage on storage capacitor 44. The p-channel enhancement MOSFET of transmission gate 43 provides a low impedance path to $V_{OUT}$ for the channel charge of the n-channel enhancement MOSFET of transmission gate 43 to dissipate during the delay period between complementary clock signals. Channel charge from the n-channel enhancement MOSFET of transmission gate 43 dissipates directly to $V_{OUT}$ as indicated by an arrow 45, directly to voltage source 42 as indicated by an arrow 49, and indirectly through the p-channel enhancement MOSFET of transmission gate 43 to $V_{OUT}$ as indicated by an arrow 48. Thus, more than half of the channel charge of the n-channel enhancement MOSFET of transmission gate 43 is coupled to storage capacitor 44. Charge canceling transmission gate 46 does not negate all the channel charge, thus an error voltage on storage capacitor 44 is produced.

A solution for reducing an error voltage on storage capacitor 44 is to provide clock signals for enabling and disabling transmission gates 43 and 46 simultaneously. In other words, a clock signal transitions simultaneously with a complementary clock signal such that little or no delay exists between the two signals. An Operational Transconductance Amplifier (OTA) is a circuit that is compatible for being used as a clock generation circuit and provides simultaneous complementary signals. For example, disabling transmission gate 43 with simultaneous complementary clock signals turns off both the n and p-channel enhancement MOSFETs of transmission gate 43 simultaneously such that the channel charge of each device equally exits the input and output of transmission gate 43. Another benefit is that the charge negating transmission gate 46 is operated simultaneously and identically to transmission gate 43 which provides a better match for canceling voltage error.

Simulations of a switched capacitor network using a standard clock circuit with delay between the complementary clock signals and a high impedance (1 megaohm) voltage source show a voltage error on a 1 picofarad storage capacitor of approximately 9.6 percent of the stored voltage value. The voltage error varies with the voltage source capacitance (CS) with a minimum of approximately a 2.4 percent voltage error when the voltage source capacitance equals the storage capacitor capacitance.

Simulations of a switched capacitor network using simultaneous complementary clock signals significantly reduce voltage error on a storage capacitor operated under the same conditions as described hereinabove. The voltage error on the storage capacitor is reduced to a maximum of approximately 0.13 percent voltage error as the voltage source capacitance (CS) is varied from 0.10 to 10.00 picofarads. A minimum of approximately 0.003 percent voltage error was attained when the voltage source capacitance is equal to the storage capacitance (1 picofarad). It should be noted that although the storage capacitor illustrated in FIG. 4 is coupled between $V_{OUT}$ and ground, it is representative of only one of many different configurations used in switched capacitor networks for charging a storage capacitor. Simultaneous switching of the complementary clock signals reduces voltage error on a storage capacitor in most configurations by reducing the sensitivity to source impedance of a voltage source providing a voltage to a transmission gate.

Figure 5:
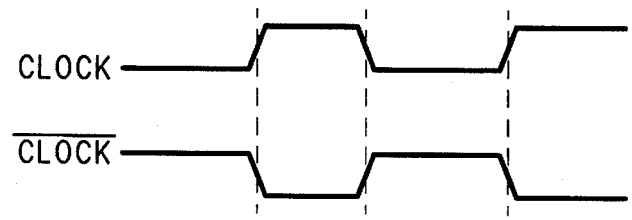
FIG. 5 is a timing diagram of the complementary clock signals provided by the clock generation circuit of FIG. 4 in accordance with the present invention.

FIG. 5 is a timing diagram illustrating the preferred embodiment of a clock signal and its complement from clock generation circuit 47 of FIG. 4. Note the transitions for both clock signals occur simultaneously and no delay exists between the inverting and non-inverting clock (or control) signals for transmission gates 43 and 46 of FIG. 4.

Figure 6:
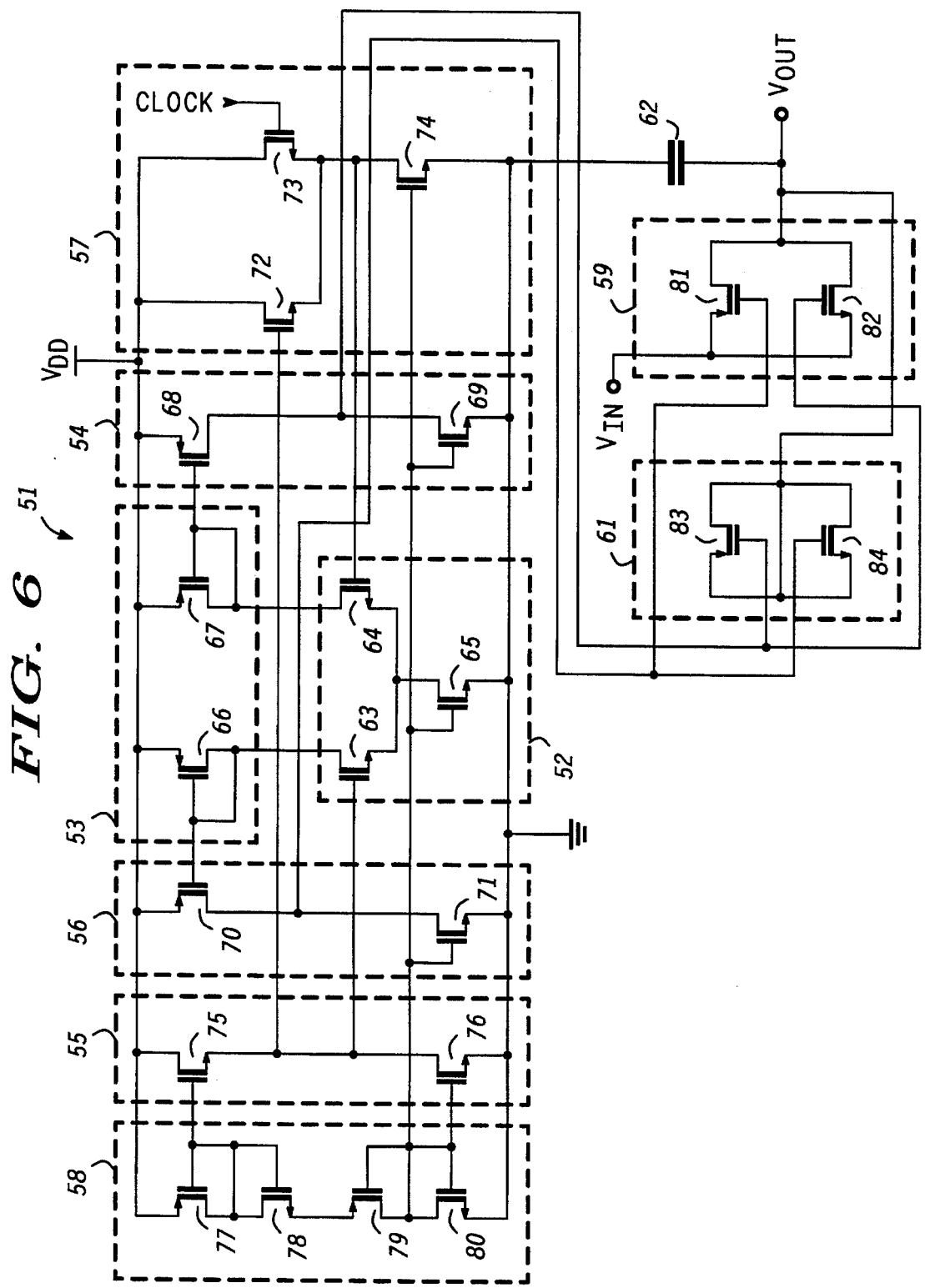
FIG. 6 is a schematic diagram of a operational transconductance amplifier used as a clock generation circuit, a transmission gate, a storage capacitor, and a charge negating transmission gate in accordance with the present invention.

FIG. 6 is a schematic diagram of a storage capacitor 62 being charged and discharged by a voltage coupled through a transmission gate 59. Complementary clock signals are provided by an operational transconductance amplifier (OTA) 51. A transmission gate 61 is coupled to storage capacitor 62 for canceling voltage error induced by enabling and disabling transmission gate 59.

Transmission gate 59 is coupled between an input $V_{IN}$ and an output $V_{OUT}$. Transmission gate 59 comprises a p-channel enhancement MOSFET 81 coupled in parallel to a n-channel enhancement MOSFET 82. Storage capacitor 62 couples between the output $V_{OUT}$ and ground. A voltage applied to $V_{IN}$ is coupled through transmission gate 59 to storage capacitor 62. Storage capacitor 62 holds the voltage when transmission gate 59 is disabled. MOSFETs 81 and 82 of transmission gate 59 receive complementary clock signals from operational transconductance amplifier 51.

Transmission gate 61 reduces voltage error by being enabled and disabled in an opposite fashion than transmission gate 59. For example, when transmission gate 59 is being enabled, transmission gate 61 is simultaneously being disabled. Transmission gate 61 comprises a p-channel enhancement MOSFET 83 coupled in parallel to a n-channel enhancement MOSFET 84. The complementary clock signals from operational transconductance amplifier 51 enable and disable transmission gate 61.

Operational transconductance amplifier 51 receives a clock signal and provides complementary clock signals that transition simultaneously. Operational transconductance amplifier 51 is a fully differential design having identical delay paths for the complementary clock signals. Any delay between the complementary clock signals provided by operational transconductance amplifier 51 produces a voltage error on storage capacitor 62. Operational transconductance amplifier 51 comprises a differential input stage 52, a load circuit 53, an output stage 54, an output stage 56, an input stage 57, a voltage reference stage 58, and a level shift stage 55.

Differential input stage 52 amplifies a difference voltage between a reference voltage provided by level shift stage 55 and a signal corresponding to a clock signal from input stage 57. Differential input stage 52 comprises n-channel enhancement MOSFETs 63, 64, and 65. MOSFET 65 is a current source for biasing MOSFETs 63 and 64. Differential input stage 52 has a first input corresponding to a gate of MOSFET 63, a second input corresponding to a gate of MOSFET 64, a first output corresponding to a drain of MOSFET 63, and a second output corresponding to a drain of MOSFET 64.

Current from the first and second outputs of differential input stage 52 are applied to load circuit 53. Load circuit 53 comprises p-channel enhancement MOSFETs 66 and 67. MOSFETs 66 and 67 respectively act as loads for the first and second outputs of the differential input stage 52. A voltage is generated across MOSFET 66 and 67 corresponding to the voltage difference across the first and second inputs of differential input stage 52.

Output stage 54 is an amplification stage for generating a digital logic level corresponding to a non-inverting clock signal. Output stage 54 comprises a p-channel enhancement MOSFET 68 and a n-channel enhancement MOSFET 69. MOSFET 69 is configured as a current source for biasing MOSFET 68. A gate of MOSFET 68 couples to the second output of differential input stage 52 for receiving a signal for amplifying.

Output stage 56 is an amplification stage for generating a digital logic level corresponding to an inverting clock signal. Output stage 56 comprises a p-channel enhancement MOSFET 70 and a n-channel enhancement MOSFET 71. MOSFET 71 is configured as a current source for biasing MOSFET 70. A gate of MOSFET 70 couples to the first output of differential input stage 52 for receiving a signal for amplifying.

The non-inverting clock signal provided by output stage 54 is applied to a gate of p-channel enhancement MOSFET 83 of transmission gate 61 and a gate of n-channel enhancement MOSFET 82 of transmission gate 59. The inverting clock signal provided by output stage 56 is applied to a gate of n-channel enhancement MOSFET 84 of transmission gate 61 and a gate of p-channel enhancement MOSFET 81 of transmission gate 59.

Voltage reference stage 58 provides a reference voltage for operational transconductance amplifier 51. Voltage reference stage 58 comprises p-channel enhancement MOSFETs 77 and 79 and n-channel enhancement MOSFETs 78 and 80. MOSFETs 77–80 are coupled in series for generating the reference voltage.

Level shift stage 55 receives the reference voltage from voltage reference stage 58 and level shifts the reference voltage to the first input of differential input stage 52. Level shifting of the reference voltage allows the differential input stage 52 to be operated under optimal conditions. Level shift stage 55 comprises n-channel enhancement MOSFETs 75 and 76. MOSFET 76 is configured as a current source for biasing MOSFET 75. MOSFET 75 is in a voltage follower configuration.

Input stage 57 receives a clock signal and provides a signal corresponding to the clock signal. The signal provided by input stage 57 is applied to the second input of differential input stage 52. Input stage 57 comprises n-channel enhancement MOSFETs 72, 73, and 74. MOSFET 74 is configured as a current source for biasing MOSFETs 72 and 73. MOSFET 72 is in a voltage follower configuration having a gate coupled for receiving a voltage from level shift stage 55 and providing a corresponding voltage to the second input of differential input stage 52. MOSFET 73 is in a voltage follower configuration having a gate coupled for receiving a clock signal and providing a corresponding signal to the second input of differential input stage 52.

Operation of operational transconductance amplifier 51 is described hereinafter. A clock signal having a logic zero level applied to input stage 57 disables MOSFET 73. MOSFET 72 is enabled and provides a voltage to the second input of differential input stage 52 that is less than the voltage provided by level shift stage 55. MOSFET 63 of differential input stage 52 has a higher current output than MOSFET 64. A voltage drop across MOSFET 66 of load circuit 53 is larger than a voltage drop across MOSFET 67. Output stage 56 amplifies the voltage across MOSFET 66 and generates a logic one level at its output. Conversely, the voltage across MOSFET 67 is not enough to bias MOSFET 68 having a current larger than MOSFET 69 of output stage 54. Output stage 54 generates a logic zero level at its output under this condition. Output stage 54 transitions to the logic zero level simultaneously as output stage 56 transitions to the logic one level.

The clock signal having a logic one level applied to input stage 57 enables MOSFET 73 while disabling MOSFET 72. MOSFET 73 couples a voltage to the second input of differential input stage 52 that is larger than the voltage provided to the first input of differential input stage 52 by level shift stage 55. MOSFET 64 of differential input stage 52 has a higher current output than MOSFET 63. The higher current from MOSFET 64 generates a larger voltage across MOSFET 67 of load circuit 53 than a voltage drop across MOSFET 66. Output stage 54 amplifies the voltage across MOSFET 67 and provides a logic one level at its output. Conversely, the voltage across MOSFET 66 is not sufficient to bias MOSFET 70 of output stage 56 to have a greater current than provided by MOSFET 71. Output stage 56 generates a logic zero level at its output. Transmission gate 59 is enabled simultaneously as transmission gate 61 is disabled. In the preferred embodiment, the drain and sources of MOSFETs 83 and 84 of transmission gate 61 are coupled to the output $V_{OUT}$. The device geometries of MOSFETs 83 and 84 are respectively made one half the size of MOSFETs 81 and 82 to effectively cancel voltage error due to enabling and disabling transmission gate 59.

Figure 7:
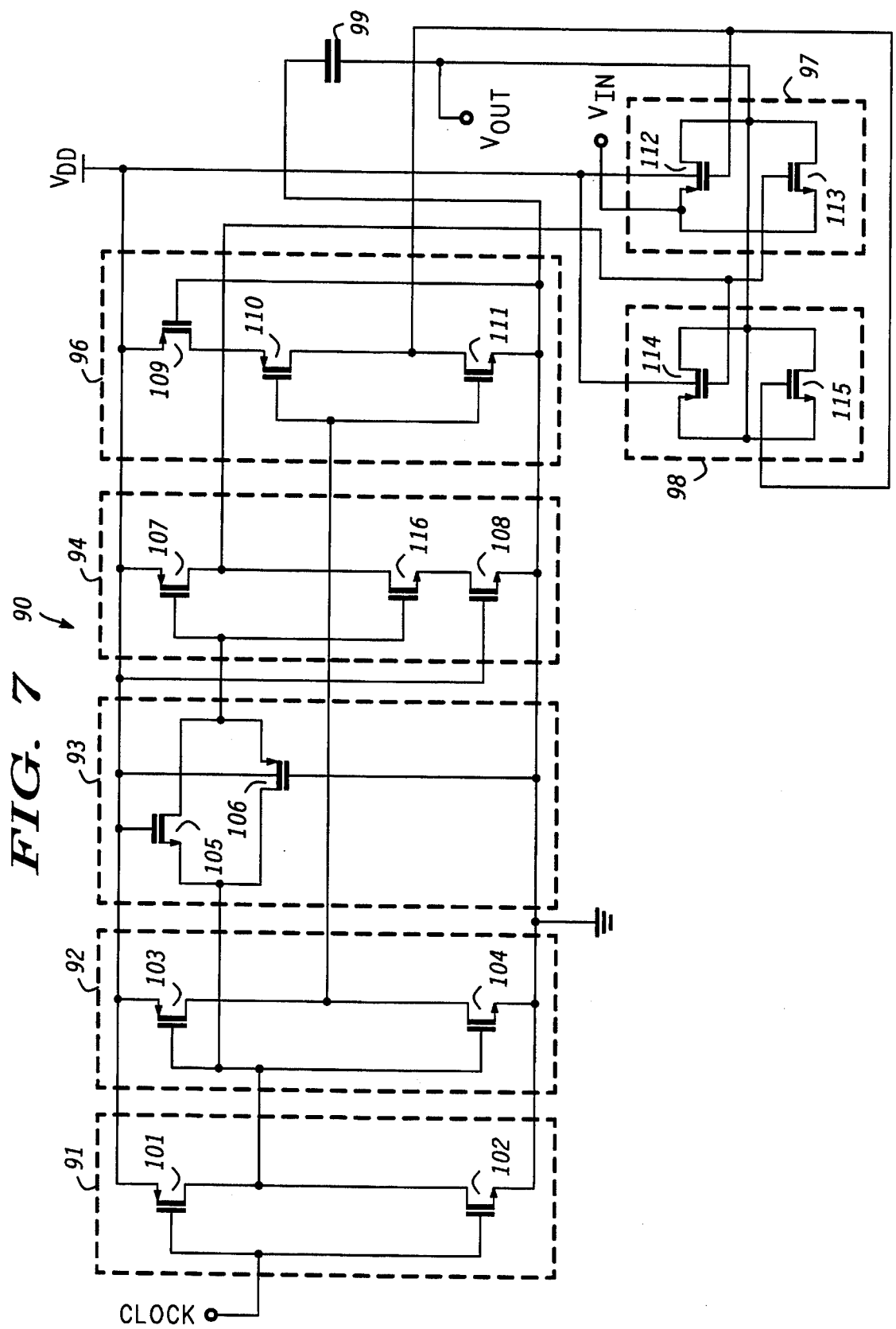
FIG. 7 is a schematic diagram of a clock generation circuit, a transmission gate, a storage capacitor, and a charge negating transmission gate in accordance with the present invention.

FIG. 7 is a schematic diagram of a transmission gate 97 for coupling a voltage to a storage capacitor 99. A clock generation circuit 90 provides complementary clock signals for enabling and disabling transmission gate 97. Transmission gate 98 is provided for canceling or negating charge coupling effects due to parasitic capacitance and channel charge. Transmission gate 97 couples between an input $V_{IN}$ and an output $V_{OUT}$. Transmission gate 97 is enabled and disabled by complementary clock signals provided by clock generation circuit 90. Transmission gate 97 comprises a p-channel enhancement MOSFET 112 and a n-channel enhancement MOSFET 113 coupled in parallel. A voltage applied to $V_{IN}$ is stored on storage capacitor 99 when transmission gate 97 is disabled. Storage capacitor 99 couples between the output $V_{OUT}$ and ground.

Transmission gate 98 is matched to transmission gate 97 for canceling voltage error due. Transmission gate 98 comprises a p-channel enhancement MOSFET 114 and a n-channel enhancement MOSFET 115 coupled in parallel. In the preferred embodiment, both the input and the output of transmission gate is coupled to the output $V_{OUT}$. The size of MOSFETs 114 and 115 of transmission gate 98 are respectively one half the size of MOSFETs 112 and 113 of transmission gate 97. Transmission gate 98 is operated in an opposite fashion than transmission gate 97. The complementary clock signals from clock generation circuit 90 simultaneously disable transmission gate 97 as transmission gate 98 is enabled. Similarly, the complementary clock signals from clock generation circuit 90 enable transmission gate 97 as transmission gate 98 is being disabled.

A clock signal is applied to clock generation circuit 90. The complementary clock signals enable and disable transmission gates 97 and 98. Clock generation circuit 90 comprises logic gates forming 2 delay paths, one inverting and one non-inverting. The delay paths have matched delays such that the complementary clock signals transition simultaneously.

Clock generation circuit 90 comprises inverters 91, 92, 94 and 96 and transmission gate 93. Inverter 91 has an input coupled to a clock input and an output. Inverter 91 comprises p-channel enhancement MOSFET 101 and n-channel enhancement MOSFET 102. Transmission gate 93 has an input coupled to the output of inverter 91 and an output. Transmission gate 93 comprises n-channel enhancement MOSFET 105 coupled in parallel with p-channel enhancement 106. Transmission gate 93 is always enabled. Inverter 94 has an input coupled to the output of transmission gate 93 and an output for providing a non-inverting clock signal. A first delay path comprises inverters 91 and 94, and transmission gate 93. Inverter 94 comprises n-channel enhancement MOSFETs 108 and 116 and p-channel enhancement MOSFET 107. MOSFETs 108 and 116 are coupled in series for delaying a negative transition at the output of inverter 94. The output of inverter 94 provides a non-inverting clock signal to a gate of MOSFET 114 of transmission gate 98 and a gate of MOSFET 113 of transmission gate 97.

Inverter 92 has an input coupled to the output of inverter 91 and an output. Inverter 92 comprises a p-channel enhancement MOSFET 103 coupled in parallel to a n-channel enhancement MOSFET 104. Inverter 96 has an input coupled to the output of inverter 92 and an output for providing an inverting clock signal. Inverter 96 comprises p-channel enhancement MOSFETs 109 and 110 and n-channel enhancement MOSFET 111. MOSFETs 109 and 110 are coupled in series for delaying the positive transition at the output of inverter 96. A second delay path includes inverters 91, 92, and 96. The output of inverter 96 provides an inverting clock signal to a gate of MOSFET 115 of transmission gate 98 and a gate of MOSFET 112 of transmission gate 97. In the preferred embodiment, the first and second delay path is adjusted to match by adjusting the size of MOSFETs 109, 110, and 111 of inverter 96 and MOSFETs 107, 116, and 108 of inverter 94. Providing a complementary clock signals that transition at approximately the same time reduces voltage error on storage capacitor 99 as described hereinabove.

By now it should be appreciated that a circuit and method has been provided that reduces voltage error when charging and discharging a storage capacitor through a transmission gate. The circuit comprises a transmission gate, a charge negating transmission gate, and a clock generation circuit for enabling the transmission gate. The clock generation circuit provides complementary clock signals that transition simultaneously or has significantly reduced delay between the complementary clock signals.

Charge is injected or pulled from the storage capacitor when the transmission gate is enabled or disabled due to parasitic capacitance or channel charge. The voltage error produced by the transmission gate is canceled by coupling a charge negating transmission gate to the storage capacitor and enabling and disabling the charge negating transmission gate opposite to the operation of the transmission gate. Simultaneously providing the complementary clock signals insures that identical conditions exist for canceling voltage error and that alternate discharge paths are not created through the transmission gate.

The method for reducing voltage error when charging and discharging a storage capacitor through a transmission gate includes providing complementary clock signals simultaneously to the transmission gate. The complementary clock signals transition at the same time. Enabling and disabling the transmission gate simultaneously removes alternate paths for discharging channel charge of the transistor which increases voltage error. A charge negating transmission gate is operated in an opposite fashion to the transmission gate to cancel charge injection and channel charge.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit for reducing voltage error when charging and discharging a storage capacitor through a first transmission gate, the circuit comprising:

a clock generation circuit providing complementary control signals for enabling and disabling the first transmission gate, said complementary control signals transition simultaneously having no delay therebetween; and a second transmission gate coupled to the storage capacitor for canceling voltage error, said second transmission gate being respectively enabled and disabled by the complementary control signals as the first transmission gate is disabled and enabled.

2. The circuit as recited in claim 1 wherein the first transmission gate comprises:

a first transistor of a first conductivity type having a first electrode coupled for receiving a voltage, a control electrode coupled for receiving a non-inverting control signal, and a second electrode coupled to the storage capacitor; and a second transistor of a second conductivity having a first electrode coupled for receiving said voltage, a control electrode coupled for receiving an inverting control signal, and a second electrode coupled to the storage capacitor.

3. The circuit as recited in claim 2 wherein said second transmission gate comprises:

a first transistor of said first conductivity type having a first and a second electrode coupled to the storage capacitor, and a control electrode coupled for receiving said inverting control signal; and a second transistor of said second conductivity type having a first and a second electrode coupled to the storage capacitor, and a control electrode coupled for receiving said non-inverting control signal.

4. A circuit for reducing voltage error when charging and discharging a storage capacitor through a first transmission gate, the circuit comprising:

a clock generation circuit providing complementary control signals for enabling and disabling the first transmission gate, said complementary control signals transition simultaneously having no delay therebetween;

the first transmission gate comprising:

a first transistor of a first conductivity type having a first electrode coupled for receiving a voltage, a control electrode coupled for receiving a non-inverting control signal, and a second electrode coupled to the storage capacitor; and a second transistor of a second conductivity having a first electrode coupled for receiving said voltage, a control electrode coupled for receiving an inverting control signal, and a second electrode coupled to the storage capacitor; and a second transmission gate coupled to the storage capacitor for canceling voltage error, said second transmission gate being respectively enabled and disabled by the complementary control signals as the first transmission gate is disabled and enabled, the second transmission gate comprising:

a first transistor of said first conductivity type having a first and a second electrode coupled to the storage capacitor, and a control electrode coupled for receiving said inverting control signal; and a second transistor of said second conductivity type having a first and a second electrode coupled to the storage capacitor, and a control electrode coupled for receiving said non-inverting control signal wherein said first and second transistors of the second transmission gate are respectively one half a size of said first and second transistors of the first transmission gate.

5. The circuit as recited in claim 4 wherein said clock generation circuit is an operational transconductance amplifier.

6. The circuit as recited in claim 5 wherein said operational transconductance amplifier comprises:

a voltage reference stage having an output;

a level shift stage having an input coupled to said output of said voltage reference stage, and an output;

a differential input stage having a first input coupled to said output of said level shift stage, a second input, a first output, and a second output;

an input stage having an input for receiving a control signal and an output coupled to said second input of said differential input stage;

a first output stage having an input coupled to said first output of said differential input stage and an output for providing an inverting control signal; and a second output stage having an input coupled to said second output of said differential input stage and an output for providing a non-inverting control signal.

7. The circuit as recited in claim 6 wherein said input stage comprises:

a first transistor having a first electrode coupled for receiving a first power supply voltage, a control electrode coupled to said output of said level shift stage, and a second electrode coupled to said second input of said differential input stage;

a second transistor having a first electrode coupled for receiving said first power supply voltage, a control electrode coupled for receiving said control signal, and a second electrode coupled to said second input of said differential input stage; and a current source having a first terminal coupled to said second input of said differential input stage and a second terminal coupled for receiving a second power supply voltage.

8. The circuit as recited in claim 4 wherein said clock generation circuit includes an input for receiving a control signal, a first output for providing a non-inverting control signal, and a second output for providing an inverting control signal, said clock generation circuit comprising:

a first circuit of series coupled logic gates for providing a non-inverting control signal, said first circuit having an input and an output respectively coupled to said input and said first output of said clock generation circuit; and a second circuit of series coupled logic gates for providing an inverting control signal, said second circuit having an input and an output respectively coupled to said input and said second output of said clock generation circuit wherein a delay path of said first and second circuits are matched for minimizing delay between said non-inverting and inverting control signals.

9. The circuit as recited in claim 4 wherein said clock generation circuit comprises:

a first inverter having an input coupled for receiving a control signal and an output;

a transmission gate having an input coupled to said output of said first inverter and an output;

a second inverter having an input coupled to said output of said transmission gate and an output for providing a non-inverting control signal;

a third inverter having an input coupled for to said output of said first inverter and an output; and a fourth inverter having an input coupled to said output of said third inverter and an output for providing an inverting control signal wherein a delay of said transmission gate and said second inverter is approximately equal to a delay of said third inverter and said fourth inverter.

10. The circuit as recited in claim 9 wherein said fourth inverter comprises:

a first transistor of a first conductivity type having a first electrode, a control electrode coupled for receiving a first power supply voltage, and a second electrode coupled for receiving a second power supply voltage;

a second transistor of said first conductivity type having a first electrode, a control electrode, and a second electrode coupled to said first electrode of said first transistor; and a third transistor of a second conductivity type having a first electrode coupled to said first electrode of said second transistor, a control electrode coupled to said control electrode of said second transistor, and a second electrode coupled for receiving said first power supply voltage wherein said control electrode of said second and third transistors corresponds to said input of said fourth inverter and wherein said first electrode of said second and third transistors corresponds to said output of said fourth inverter.

11. A circuit comprising:

a switched capacitor network including at least one transmission gate coupled to a storage capacitor, said at least one transmission gate coupling a voltage to said storage capacitor, said storage capacitor storing said voltage when said at least one transmission gate is disabled; and a clock generation circuit receiving a clock signal and providing complementary clock signals to said switched capacitor network for enabling and disabling said at least one transmission gate, said complementary clock signals transition simultaneously having no delay therebetween thereby reducing voltage error on said storage capacitor.

12. The circuit of claim 11 further including a transmission gate for canceling voltage error, said transmission gate is coupled to said storage capacitor and is respectively enabled and disabled by said complementary clock signals when said at least one transmission gate is disabled and enabled.

13. The circuit of claim 11 wherein said clock generation circuit is an operational transconductance amplifier having an input for receiving said clock signal and complementary outputs for providing complementary clock signals that transition simultaneously.

14. The circuit of claim 11 wherein said clock generation circuit comprises:

a first circuit of series coupled logic gates for providing a non-inverting clock signal; and a second circuit of series coupled logic gates for providing an inverting clock signal, said first and second circuits receiving said clock signal and a delay path of said first and second circuits have matched delays for minimizing delay between said non-inverting and inverting clock signals.

15. A method for reducing voltage error when charging and discharging a storage capacitor through a first transmission gate, the first transmission gate being coupled for receiving a voltage and being enabled and disabled by complementary control signals, the storage capacitor storing a voltage when the first transmission gate is disabled, the method comprising a step of providing the complementary control signals such that the complementary control signals transition at a same time having no delay therebetween.

16. The method as recited in claim 15 further including the steps of:

coupling a second transmission to the storage capacitor for canceling voltage error;

enabling said second transmission gate with the complementary control signals when the first transmission gate is being disabled; and disabling said second transmission gate with the complementary control signals when the first transmission gate is being enabled.

* * * * *